(12) United States Patent
Chalom et al.

(10) Patent No.: US 8,360,491 B2
(45) Date of Patent: *Jan. 29, 2013

(54) SUBSTRATE PICK

(75) Inventors: Mike Chalom, Boise, ID (US); Jon Oliver, Boise, ID (US); Ty Gabby, Meridian, ID (US); Timothy A. Strodtbeck, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/837,632

(22) Filed: Jul. 16, 2010

(65) Prior Publication Data

US 2010/0276953 A1 Nov. 4, 2010

Related U.S. Application Data

(62) Division of application No. 11/469,185, filed on Aug. 31, 2006, now Pat. No. 7,806,449.

(51) Int. Cl.
*B25J 1/00* (2006.01)
*B66C 1/04* (2006.01)
(52) U.S. Cl. ............... 294/15; 294/65.5; 294/104
(58) Field of Classification Search ............... 294/8.5, 294/6, 28, 30, 99.1, 99.2, 65.5, 104, 902; 15/150; 335/302, 303, 305; 269/8
See application file for complete search history.

(56) References Cited

U.S. PATENT DOCUMENTS

| | | | |
|---|---|---|---|
| 219,999 | A | 9/1879 | Thomas |
| 3,115,657 | A | 12/1963 | Kikas |
| 3,783,873 | A | 1/1974 | Jacobs |
| 4,595,222 | A | 6/1986 | Schumacher |
| 4,656,418 | A * | 4/1987 | Boston et al. ............... 324/127 |
| 4,662,667 | A | 5/1987 | Gilligan et al. |
| 5,799,999 | A | 9/1998 | Schneider et al. |
| 6,179,357 | B1 | 1/2001 | Gabriel |
| 6,386,609 | B1 | 5/2002 | Govzman |
| 6,723,092 | B2 | 4/2004 | Brown et al. |
| 6,869,117 | B1 | 3/2005 | Blum |
| 2007/0284795 | A1 | 12/2007 | Lancaster-Larocque |
| 2008/0054657 | A1 | 3/2008 | Chalom |

FOREIGN PATENT DOCUMENTS

JP 3-178792 A 8/1991

* cited by examiner

*Primary Examiner* — Paul T Chin
(74) *Attorney, Agent, or Firm* — Perkins Coie LLP

(57) ABSTRACT

Disclosed is a method for handling devices, such as reticles, in a semiconductor manufacturing environment. In one illustrative embodiment, the method includes: providing a pick comprised of a plurality of spaced-apart grippers with a pivot point between the gripper about which point the spaced-apart grippers are configured to pivot; creating a vacuum in a body proximate to the pivot point, wherein the vacuum is configured to draw particles generated in the area of the pivot into the body; and generating a magnetic force between magnets, wherein the magnetic force drives at least one gripper toward another gripper to grasp a semiconducting substrate or a reticle between the grippers.

15 Claims, 3 Drawing Sheets

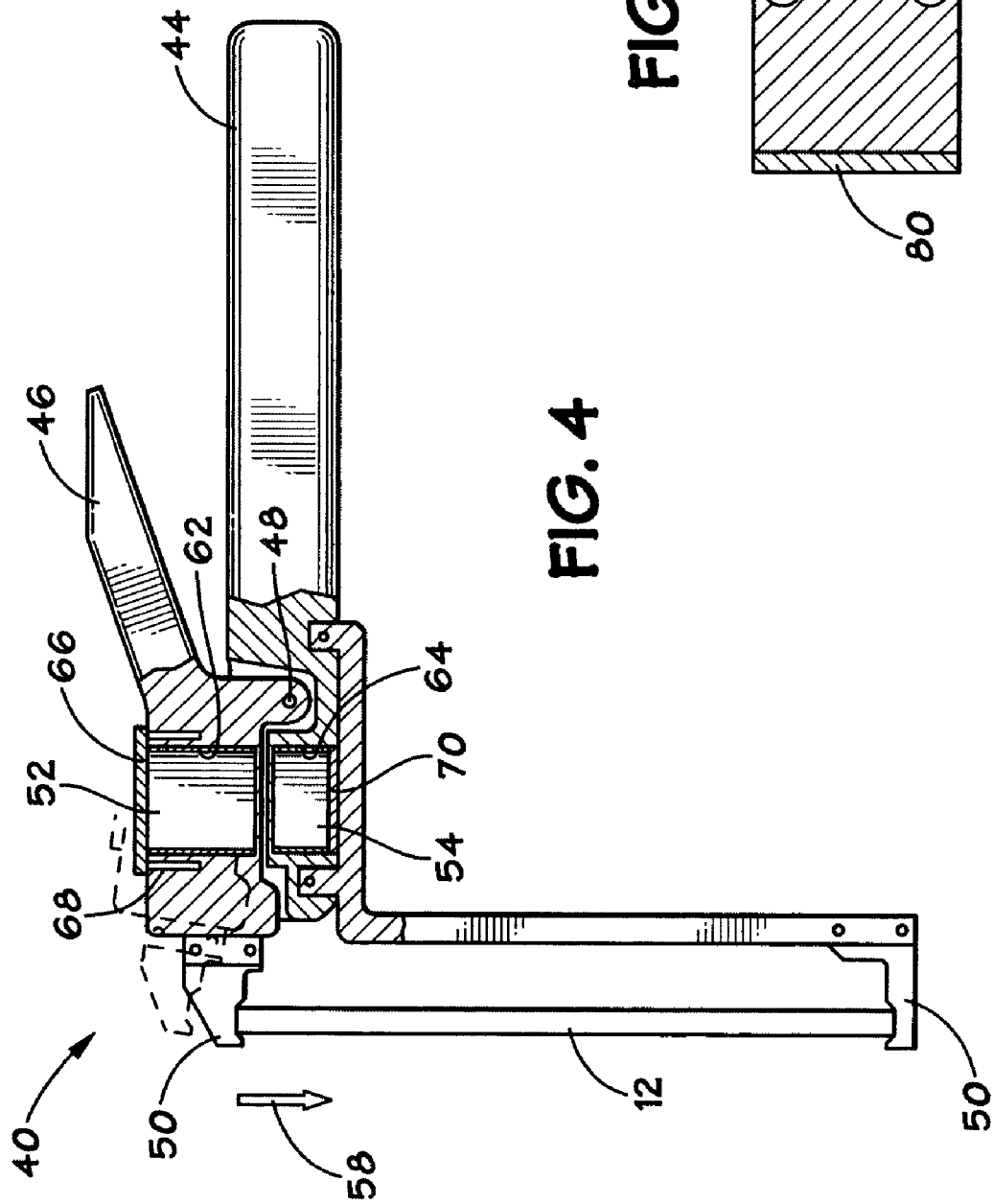

SUBSTRATE PICK

CROSS-REFERENCE TO RELATED APPLICATION

This application is a divisional of U.S. application Ser. No. 11/469,185 filed Aug. 31, 2006, now U.S. Pat. No. 7,806,449, which is incorporated herein by reference in its entirety.

BACKGROUND OF THE INVENTION

1. Field of the Invention

The present invention is generally directed to material handling devices in the semiconductor manufacturing industry, and, more particularly, to a device for handling devices, such as reticles, in a semiconductor manufacturing environment.

2. Description of the Related Art

The manufacture of integrated circuit devices, e.g., memory devices, logic devices, etc., is a very complex activity that requires very precise tools and processes. Manufacturing such integrated circuit products may involve hundreds of complex process operations that involve well-known deposition, etching, photolithography and planarization techniques and equipment. Manufacturers of integrated circuit devices go to great lengths in attempting to insure that the manufacturing environment for such integrated circuit devices is extremely clean. If the integrated circuit devices have sufficient particle contamination, the operational capability of the integrated circuit device may be reduced or, in some cases, destroyed.

The manufacture of integrated circuits involves many processes. One process that is universally employed in manufacturing such devices is photolithography. In general, photolithography involves forming a layer of photoresist material above a semiconducting substrate and, thereafter, irradiating the photoresist material with light that is projected through a reticle. Through this process, the pattern on the reticle is transferred to the layer of photoresist material. Ultimately, the exposed layer of photoresist will be developed to thereby define a photoresist mask layer. The mask layer may be used to pattern an underlying layer of material using etching processes that are well known to those skilled in the art.

Reticles used in manufacturing modern integrated circuit devices must exhibit a very high degree of precision and are very expensive to manufacture. For example, a typical reticle employed in manufacturing memory devices may cost approximately $60,000-$90,000 depending upon the complexity of the image formed on the reticle.

Unfortunately, it is frequently necessary for personnel to handle or move such reticles for a variety of reasons, e.g., a new product is being processed. The reticles are typically made of glass and may have a generally rectangular or square shape. A reticle may have a thickness of approximately 0.25-0.325 inches. Thus, great care must be exercised when handling such reticles as they may break or crack if dropped or otherwise subjected to undesirable impact loads or stresses. It is also extremely important that such reticles be free of particle contaminants as such particles may scratch the surface of the reticle and/or adversely impact the pattern transferred to the underlying layer of photoresist during the photolithography process.

FIG. 1 depicts an illustrative prior art reticle pick 10 that is employed in handling a reticle 12. The pick 10 generally comprises a body 14, a trigger 16, a spring 18, a pivot point 20, and a plurality of grippers 22. In operation, the trigger 16 is depressed which compresses the spring 18. The force generated by the compressed spring 18 tends to force the upper gripper 22A in the direction indicated by the arrow 24. Thus, the compression of the spring 18 provides the force to clamp the reticle 12 within the grippers 22.

There are several problems associated with the use of the prior art pick 10 depicted in FIG. 1. For example, the compression/relaxation cycle experienced by the spring 18 during operation can lead to the generation of undesirable particles that may contaminate the reticle 12 or other aspects of the semiconductor manufacturing environment. Additionally, over time, the spring 18 may tend to rust, thereby generating additional particles. Typically, such a spring-type pick 10 is subjected to relatively frequent maintenance procedures, such as frequent removal and cleaning, in an effort to reduce the contaminants resulting from the spring 18. Such maintenance efforts are time-consuming and may not effectively prevent the problems caused by such spring-type picks 10.

The present invention is directed to a device and various methods that may solve, or at least reduce, some or all of the aforementioned problems.

BRIEF DESCRIPTION OF THE DRAWINGS

The invention may be understood by reference to the following description taken in conjunction with the accompanying drawings, in which like reference numerals identify like elements, and in which:

FIG. 4 is a cross-sectional side view of yet another illustrative embodiment of a pick in accordance with the present invention; and FIG. 5 is an enlarged view of a shield ring that may be employed with magnets of the present invention.

Figure 1:
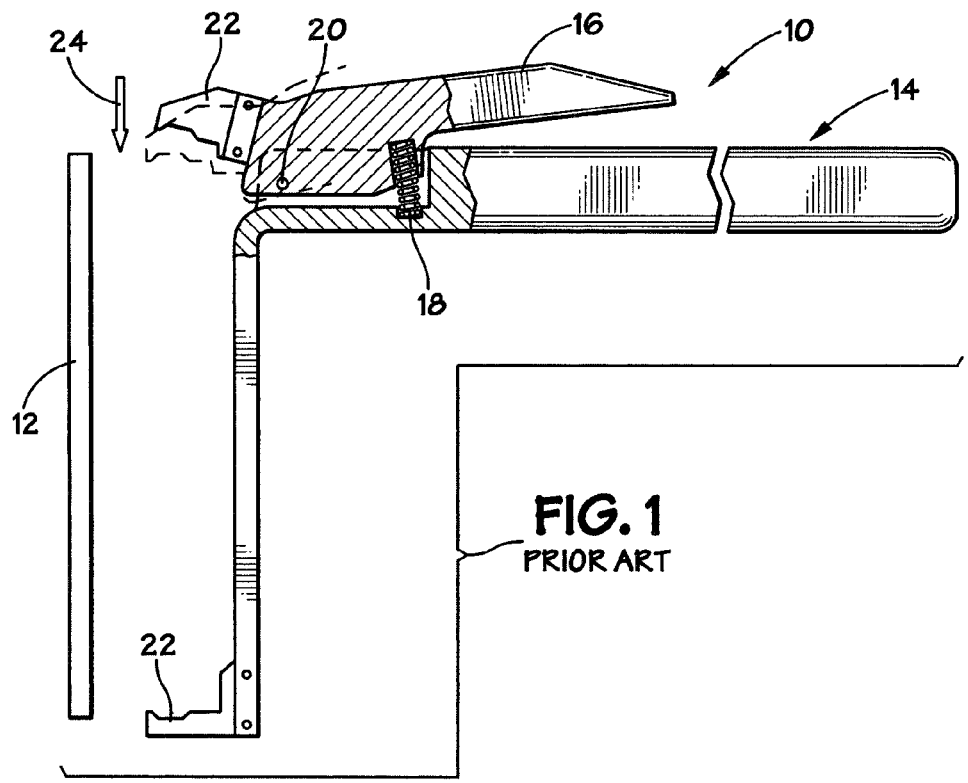
FIG. 1 is a cross-sectional side view of an illustrative prior art spring-type substrate pick.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. For purposes of clarity and explanation, the relative sizes of the various features depicted in the drawings may be exaggerated or reduced as compared to the actual size of those features or structures. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be explicitly set forth in the specification in a definitional manner that directly and unequivocally provides the special definition for the term or phrase.

Figure 3:
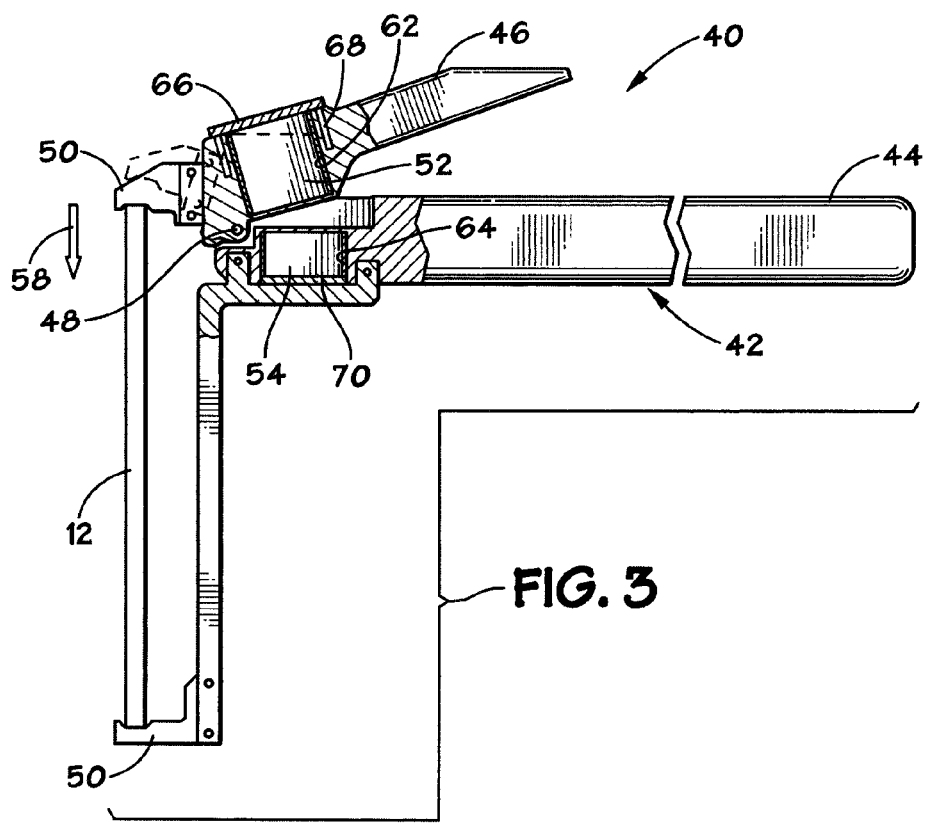
FIG. 3 is a cross-sectional side view of one illustrative embodiment of a pick in accordance with the present invention.
Figure 2:
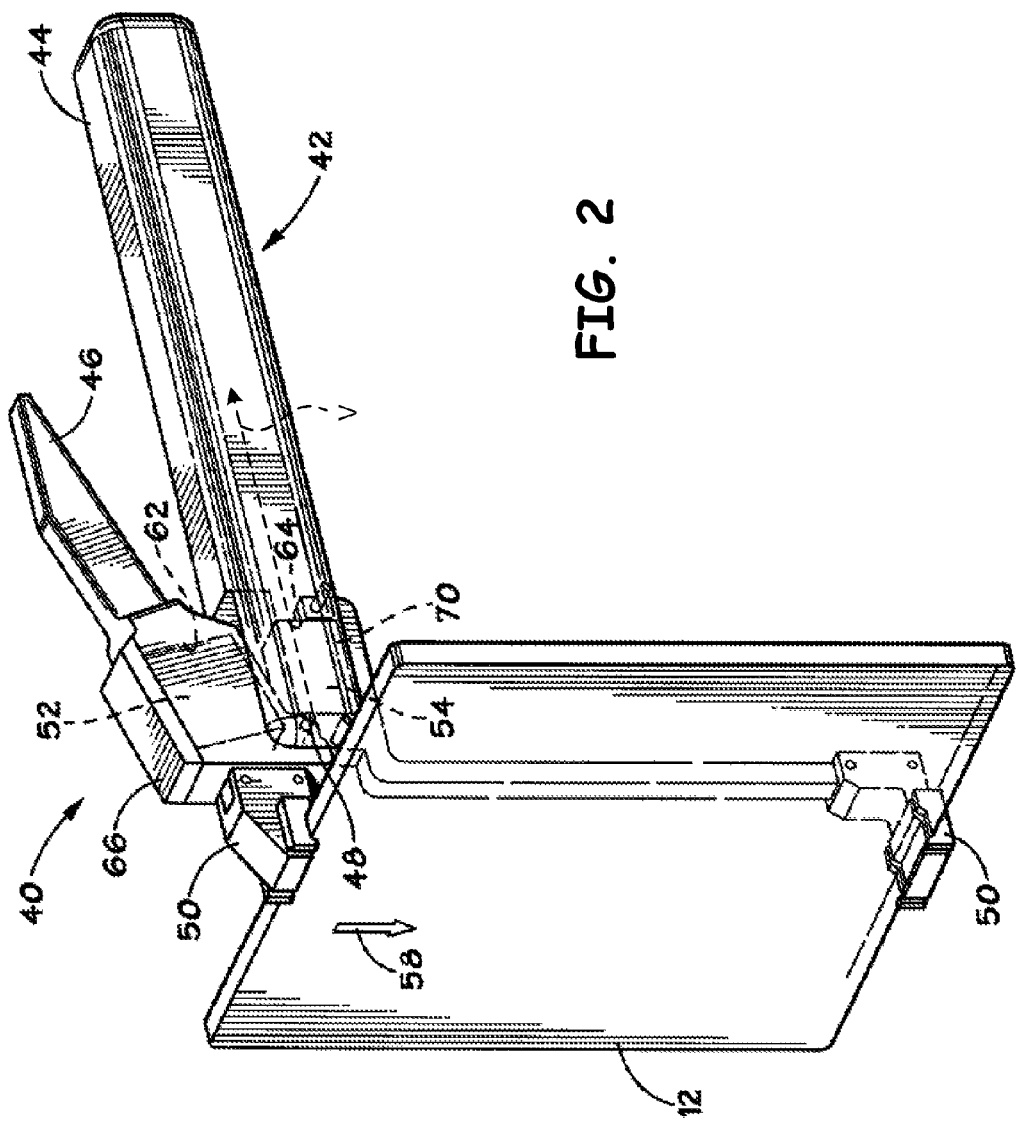
FIG. 2 is a perspective view of one illustrative embodiment of a pick in accordance with the present invention.

FIG. 2 is a perspective view depicting one illustrative embodiment of a pick 40 in accordance with one aspect of the present invention. FIG. 3 is a side view of the illustrative pick 40. The pick 40 comprises a body 42, a handle 44, a trigger 46, a pivot point 48, and a plurality of grippers 50. The pick 40 further comprises at least one magnet 52 coupled to the trigger 46 and at least one magnet 54 coupled to the handle 44. As shown in FIGS. 2 and 3, a semiconducting substrate or reticle 12 is securely positioned between the grippers 50. The shape of the grippers 50 may vary depending upon the shape of the object that is to be grasped using the pick 40.

In the illustrative embodiment depicted in FIGS. 2 and 3, the magnets 52, 54 are positioned such that like poles of the magnets 52, 54 are facing each other, e.g., the positive pole of the magnet 52 faces the positive pole of the magnet 54. Of course, the magnets 52, 54 could be positioned such that the negative poles of the magnets 52, 54 are facing one another. With like poles of the magnets 52, 54 facing one another, they repel from one another the closer they are brought together, i.e., by depressing the trigger 46. The force generated by the magnetic repulsion of the magnets 52, 54 in this configuration generates a force that tends to bias the upper gripper in the direction indicated by arrow 58, e.g., a clamping force. This magnetic force is employed to provide the necessary clamping force to hold the reticle 12 between the grippers 50. Note that, in this illustrative embodiment, the magnets 52, 54 and the grippers 50 are positioned on opposite sides of the pivot point 48. In this illustrative embodiment, when the trigger 46 is actuated, e.g., depressed, the spacing between the magnets 52, 54 is decreased and the upper gripper 50 is urged to its open position, as indicated by the dashed lines in FIGS. 2 and 3. Due to the magnetic repulsion of the like poles of the magnets 52, 54, when the trigger 46 is released, the upper gripper 50 is urged in the direction indicated by the arrow 58, i.e., toward its closed position, to thereby grasp the semiconducting substrate or reticle 12 between the grippers 50.

In the particular embodiment depicted in FIG. 2, the magnet 52 is positioned within a recess 62 formed in the trigger 46 and the magnet 54 is positioned within a recess 64 formed in the handle 44. A cap 66 is positioned over the recess 62 and secured to the trigger by pins 68. A cap 70 is positioned over the recess 64 and secured to the handle by pins (not shown). Of course, the magnets 52, 54 may be retained in the recesses 62, 64 by a variety of known mechanical techniques.

FIG. 4 depicts an alternative aspect of the present invention. In this embodiment, the magnets 52, 54 are positioned between the pivot point 48 and the grippers 50, i.e., the magnets 52, 54 and the grippers 50 are positioned on the same side of the pivot point 48. In this illustrative embodiment, the magnets 52, 54 are positioned such that opposite poles of the magnets 52, 54 are facing one another. In this configuration, the attractive magnetic force created by the magnetic attraction between the magnets 52 and 54 creates a force that tends to urge the upper gripper in the direction indicated by the arrow 58, e.g., a clamping force. By depressing the trigger 46, the spacing between the magnets 52, 54 and the grippers 50 is increased. Releasing the trigger 46 allows the attractive magnetic force between the opposite poles of the magnets 52, 54 to urge the grippers 50 to a closed position so as to grasp the semiconducting substrate or reticle 12. It should also be noted that, in some embodiments, the cavity or area under the pivot point 48 can be exhausted or a negative pressure (vacuum) V can be established through the body 44 in an effort to remove any particles generated in the area of the pivot point 48.

FIG. 5 is a cross-sectional view of an illustrative application wherein it may be desirable to position some form of magnetic shielding 80 around the side surfaces of the magnets 52, 54 to limit the reach of the magnetic field generated by the magnets 52, 54. In one illustrative embodiment, this magnetic shielding 80 may be a nickel-based material having a thickness of approximately 0.04-0.08 inches. The shielding 80 may be attached by various means, e.g., tape, glue, pins, etc.

The magnets 52, 54 may be of any size and strength to provide the necessary clamping force to the grippers 50. The size, type and strength of the magnets 52, 54 may vary depending upon the particular application. Additionally, it should be understood that the schematically depicted magnets 52, 54 may be a single magnet or a plurality of magnets. In one illustrative embodiment, neodymium type magnets (type N38) having a flux density of 12.4 KGs are employed in the substrate picks 40 of the present invention. More information regarding such magnets may be obtained by visiting the following website: http://www.kjmagnetics.com/specs.asp.

As indicated above, traditional magnets 52, 54 may be employed in the present invention. However, it should also be understood that electromagnets may also be employed with the present invention to generate the magnetic force used to provide the necessary clamping force to the grippers 50. Power for such electromagnets may be supplied by a battery or by electrical power supplied via a wire.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    providing a pick comprised of a plurality of spaced-apart grippers with a pivot point between the grippers about which point the spaced-apart grippers are configured to pivot;
    creating a vacuum in a body proximate to the pivot point, wherein the vacuum is configured to draw particles generated in the area of the pivot point into the body; and
    generating a magnetic force between magnets, wherein the magnetic force drives at least one gripper toward another gripper to grasp a semiconducting substrate or a reticle between the grippers.

2. The method of claim 1 wherein generating the magnetic force to grasp the semiconducting substrate or the reticle between the grippers comprises positioning like poles of a plurality of magnets adjacent one another to generate the magnetic force.

3. The method of claim 1 wherein generating the magnetic force to grasp the semiconducting substrate or the reticle between the grippers comprises positioning opposite poles of a plurality of magnets adjacent one another to generate the magnetic force.

4. The method of claim 1, further comprising providing a plurality of magnets to generate the magnetic force.

5. The method of claim 4, further comprising providing magnetic shielding around at least a portion of each of the plurality of magnets.

6. The method of claim 1 wherein said pick comprises a trigger and the method further comprises actuating the trigger to release the semiconducting substrate or reticle.

7. The method of claim 4 wherein generating the magnetic force to grasp the semiconducting substrate or the reticle between the grippers comprises:
   actuating a trigger to increase a spacing between the plurality of magnets;
   after actuating the trigger, positioning the semiconducting substrate or reticle between the plurality of grippers; and
   releasing the trigger to grasp the semiconducting substrate or reticle between the grippers.

8. The method of claim 4, further comprising:
   actuating a trigger to decrease a spacing between the plurality of magnets;
   after actuating the trigger, positioning the semiconducting substrate or reticle between the plurality of grippers; and
   releasing the trigger to grasp the semiconducting substrate or reticle between the grippers.

9. The method of claim 7 wherein the plurality of magnets are positioned such that opposite poles of the magnets face one another.

10. The method of claim 8 wherein the plurality of magnets are positioned such that like poles of the magnets face one another.

11. A method, comprising:
   providing a pick comprised of a plurality of spaced-apart grippers, a trigger and a plurality of spaced-apart magnets having the like poles of the magnets facing one another, wherein at least one of the grippers is connected to a pivot point;
   providing a vacuum in a cavity under the pivot point configured to draw particles generated in the cavity under the pivot point into the vacuum;
   actuating the trigger to decrease a spacing between the plurality of magnets;
   after actuating the trigger, positioning a semiconducting substrate or reticle between the plurality of grippers; and
   releasing the trigger to grasp the semiconducting substrate or reticle between the grippers.

12. The method of claim 11, further comprising providing magnetic shielding around at least a portion of each of the plurality of magnets.

13. The method of claim 11, further comprising releasing the semiconducting substrate or reticle.

14. A method, comprising:
   providing a plurality of spaced-apart grippers;
   actuating a trigger that is operatively coupled to one of the grippers and a body at a pivot point;
   creating a vacuum through the body under the pivot point, the vacuum being configured to draw particles from an area under the pivot point into the vacuum; and
   urging one of the grippers toward at least one other gripper by a plurality of magnets for producing a magnetic clamping.

15. A method, comprising:
   providing a handle comprising an elongated bar with a first side and a second side, wherein the handle has a first magnet;
   providing a first gripper fixedly attached to the first side of the handle and extending away from the handle;
   providing a second gripper rotatably attached to the second side of the handle by a pivot point, wherein the second gripper pivots about the pivot point between a closed position and an open position, and wherein the second gripper comprises
      a lever that extends away from the handle when the second gripper is in the closed position such that pressing the lever toward the handle causes the second gripper to pivot about the pivot point toward the open position; and
      a second magnet positioned proximate the first magnet when the second gripper is in the closed position, the first magnet and the second magnet applying an attractive force to urge the second gripper toward the closed position; and
   creating a vacuum in an area under the pivot point to draw particles generated by the pivot point into the vacuum.

* * * * *

UNITED STATES PATENT AND TRADEMARK OFFICE
CERTIFICATE OF CORRECTION

PATENT NO. : 8,360,491 B2  
APPLICATION NO. : 12/837632  
DATED : January 29, 2013  
INVENTOR(S) : Mike Chalom et al.

Page 1 of 1

It is certified that error appears in the above-identified patent and that said Letters Patent is hereby corrected as shown below:

On the Title Page, Item (57), under "Abstract", column 2, line 8, after "pivot" insert -- point --.

Signed and Sealed this  
Thirteenth Day of August, 2013

Teresa Stanek Rea  
*Acting Director of the United States Patent and Trademark Office*